United States Patent
Clark et al.

(10) Patent No.: US 6,384,952 B1
(45) Date of Patent: *May 7, 2002

(54) VERTICAL COMB DRIVE ACTUATED DEFORMABLE MIRROR DEVICE AND METHOD

(75) Inventors: Rodney L. Clark, Gurley; Jay A. Hammer; John R. Karpinsky, both of Huntsville, all of AL (US)

(73) Assignee: MEMS Optical Inc., Huntsville, AL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/049,121

(22) Filed: Mar. 27, 1998

Related U.S. Application Data

(60) Provisional application No. 60/041,725, filed on Mar. 27, 1997.

(51) Int. Cl.[7] .............................................. G02B 26/08
(52) U.S. Cl. ..................... 359/224; 359/198; 359/223
(58) Field of Search ........................... 359/196–199, 359/201, 212–214, 223, 224; 310/309

(56) References Cited

U.S. PATENT DOCUMENTS

| | | | |
|---|---|---|---|
| 5,745,278 A | * 4/1998 | La Fiandra | 359/224 |
| 5,867,297 A | * 2/1999 | Kiang et al. | 359/198 |
| 5,969,848 A | * 10/1999 | Lee et al. | 359/298 |

OTHER PUBLICATIONS

Selvakumar et al, "Vertical Comb Array Microactuators", 1995 IEEE.*

IEEE Publication No. 0–7803–2503–6, pp. 43–48, Article: Verticle Comb Array Microactuators, A. Selvakumar, K. Najafi, W.H. Juan and S. Pang; University of Michigan, 1995.*

* cited by examiner

*Primary Examiner*—James Phan

(57) ABSTRACT

A deformable mirror includes a vertical comb actuator having a reflective surface attached thereto. The vertical comb drive includes stationary elements interspersed with moving elements. When a potential difference is provided between these elements, the moving elements are pulled downward, thereby deforming the reflective surface. The vertical comb drive typically includes a plurality of actuators, which are individually electrically addressed. Each actuator may be an array of interspersed elements or a cavity and corresponding tooth. Springs support the moving elements and bias the reflective surface in an original position. The vertical comb drive provides a large stroke and substantially linear voltage-versus-displacement curve throughout the stroke.

34 Claims, 5 Drawing Sheets

VERTICAL COMB DRIVE ACTUATED DEFORMABLE MIRROR DEVICE AND METHOD

CROSS-REFERENCE TO RELATED APPLICATIONS

This application claims priority under 35 U.S.C. § 119(e) of provisional application U.S. Serial No. 60/041,725 filed on Mar. 27, 1997 which is hereby incorporated by reference in its entirety.

GOVERNMENT RIGHTS

The U.S. Government has rights in the present application under Contract BMDO 96-002,003.

BACKGROUND OF THE INVENTION

1. Field of the Invention

The present invention relates to adaptive optics. More particularly, it relates to the use of a vertical comb drive to actuate the deformable mirror in an adaptive optical system.

2. Description of Related Art

Atmospheric turbulence has frustrated astronomers ever since telescopes were invented. Atmospheric turbulence introduces aberrations on the wavefront of visible light, causing stars to twinkle and distant objects to shimmer. Atmospheric turbulence also limits the resolution of microscopes, endoscopes, and other optical imaging systems.

Adaptive optics systems can be used to measure and compensate for rapidly fluctuating wavefront distortions which blur the images of objects viewed through the turbulent atmosphere. While many adaptive optics systems are currently being used, they suffer from many shortcomings. Current systems are typically complex, expensive, unreliable and difficult to maintain, thus putting them out of reach of amateur astronomers or commercial users. Current adaptive optics systems are also very heavy and operate at relatively slow speed making them unsuitable for airborne applications where the fluctuating wavefront distortions move past the aperture at a much faster rate than stationary systems.

FIG. 1 illustrates a simple adaptive optics application. A micromachine deformable mirror 100, fabricated as an integrated circuit, is mounted onto a printed circuit board substrate 110. A wavefront sensing and correction microchip 120 is mounted on the substrate 110 next to the deformable mirror 100. The printed circuit board contains drive electronics 115 that connect the wavefront sensor chip 120 to the deformable mirror 100 chip. Incident light 130 is reflected off the micromachine deformable mirror 100. The reflected light 140 then passes through a beam splitter 150. A portion of the reflected light 140 is redirected onto the wavefront sensor 120 by the beam splitter 150.

The wavefront sensor 120 detects any aberration in the wavefront of the reflected light 140. Once it has detected the aberration, the wavefront sensor 120 then calculates the conjugate of the aberration. By applying the conjugate of the aberration to the incident light 130 as the light strikes the deformable mirror 100, the aberration is subtracted from the wavefront, and a corrected wave of light is reflected from the deformable mirror 100. The wavefront sensor 120 drives the deformable mirror 100 via the drive electronics 115 to correct for the detected aberration.

The primary obstacles to wider use of adaptive optics systems are cost, complexity, and reliability. Should reliable, low cost solid state adaptive optic systems become commercially available, many new applications can be envisioned. Laser communications is an example of such a market. Laser communication systems can support the signal bandwidth needed for High Definition Television without the need to run fiber optic cables between a remote mobile unit and a roving camera crew. Current laser communications have limited range due to atmospheric distortions that cause beam bending and scatter energy from the beam. An adaptive optic system capable of correcting for these effects can greatly extend range and improve performance.

A low cost adaptive optics system would find immediate applications in optical microscopes. Such a system could produce significantly improved imaging in difficult medical environments improving the performance of conventional and confocal microscopes. A low cost adaptive optics system has potential to enhance the operational performance of all clinical microscopes in use today.

A low cost adaptive optics system would also find applications in endoscopy. Here the adaptive optics system can be used for both imaging and transmitting the laser energy for endoscopic surgical procedures. There is considerable medical instrumentation and diagnostic equipment in the market place today. However, higher resolution imaging and more accurate placement of laser energy is needed to improve these instruments.

A low cost adaptive optic system could also find application in ophthalmology and optometry. In this application a small low power laser device is used to create an artificial guide star on the retina of the eye. The spot of light reflected off the retina forms a source to drive a wavefront sensor of an adaptive optic system. The kind of retinal camera that stands to benefit even more from adaptive optics is the confocal scanning laser ophthalmoscope (CSLO). Many clinical applications require the ability to optically section the retina in depth. Such sectioning can be achieved with confocal imaging in principle but current CSLOs do not tap the potential of confocal imaging because the retinal image quality is too poor. A CSLO equipped with adaptive optics could reap the full benefit of confocal imaging, improving the transverse resolution of current instruments by a factor of three and the axial resolution by a factor of ten.

Typical adaptive optics systems are composed of at least three core elements: (1) a wavefront sensor to detect optical aberrations, (2) electronic circuitry to compute a correction, and (3) a deformable mirror to apply the correction. The deformable mirror is a critical component of an adaptive optics system. It is used to apply the correction to the distorted wavefront. In current technology, the deformable mirror is also the most expensive component of the adaptive optical system. In order to realize a low cost adaptive optical system, a low cost deformable mirror must be developed. The current art presents three alternative technologies for deformable mirrors: liquid crystals, stacked piezoelectrics, and Micro-Electro-Mechanical Systems ("MEMS").

Phase Modulating Liquid Crystal Display (LCD), devices offer low weight, low cost, and low power alternatives to large opto-mechanical devices. Also, cost effective bulk manufacturing methods currently exist for these devices. However, current LCD devices suffer from limited fill factor, limited bandwidth, and inadequate dynamic range. Bandwidth limitations will preclude the use of LCD's for airborne or missile applications.

Stacked piezoelectrics ("SPZT") utilize a new generation of piezoelectric technology that costs less and features the best advantages of actuators made from piezoelectric ("PZT") or lead manganese niobate ("PM") technologies. However, current SPZT devices suffer from high current operation, significant actuator nonuniformity, relatively high power dissipation, and moderate hysteresis effect. Moreover, these devices are relatively expensive when compared to liquid crystals or MEMS devices.

The recent advent of MEMS technology offers an alternative for the construction of cost effective mechanical mirror actuators. The technology is based upon the well established fabrication methods used to manufacture integrated circuits. Micromachining promises major improvements in overall performance and reduction of cost. The MEMS deformable mirrors have shown the lowest fabrication cost, lowest power consumption, lowest mass, lowest volume, elimination of hysteresis, elimination of polarization effects best power on, and lowest non-uniformity of any current deformable mirror technology. An additional advantage of this technology is that integrated electronic circuits can be fabricated directly on the same substrate as the micromirror. This allows for significant system simplification in that mirror drive electronics can be fabricated directly on the mirror substrate. MEMS technology offers light weight components, thus making it entirely suitable for ground based, airborne, and even hand held wavefront correction applications.

However, prior MEMS deformable mirror designs have been based on the electrostatic parallel plate capacitor actuators. This method of actuation has been successful but produces actuators with limited stroke, e.g., less than one micron, and a nonlinear voltage-versus-displacement curve. The nonlinear curve results from the 1/r dependence of the attractive force on gap distance. Recently, new MEMS actuator concepts have been demonstrated which use electrostatic comb drives to produce large stroke and linear voltage verses displacement curves. Unfortunately the current designs do not produce the vertical displacements necessary for use in an optical system.

SUMMARY OF THE INVENTION

It is therefore an object of the present invention to provide a low cost deformable mirror for use in an adaptive optics system which overcomes the problems noted above. It is further an object of the present invention to provide a deformable mirror with a high stroke and substantially linear voltage-versus-displacement curve.

These and other objects of the present invention may be realized by providing a deformable mirror by combining a vertical comb drive with a reflective surface. The deformable mirror may also include a spring for biasing the vertical comb drive to maintain the reflective surface in an original position absent application of a voltage to the vertical comb drive.

The vertical comb drive may include a first array of stationary elements and a second array of moving elements correspondingly interspersed with the first array. The reflective surface would be attached to the second array. A layer covering tops of elements of the second array may be provided. A spring may be used to suspend the first array relative to the second array, preferably via the layer. The stationary elements and the movable elements may be circular or planar. The layer may be attached directly to the reflective surface or with a post which is preferably in a center of the layer. Voltage may be applied to each stationary element of the first array individually or each moving element of the second array individually.

The vertical comb drive may include an array of vertical comb actuators. Each actuator of the array may be individually addressed to provide a voltage thereto. Springs for individually suspending each of the second arrays of each actuator in the array may be provided. Preferably, an anchor for supporting the springs is also provided.

The vertical comb drive may include a plurality of cavities and teeth interdigitally mounted with said cavities, the reflective surface being attached to the teeth. A top layer may be provided between the teeth and the reflective surface. A conductor for individually connecting each tooth of the teeth to a voltage source may also be provided.

These and other objects of the present invention may also be realized in accordance with a method of deforming a mirror including attaching the mirror to a vertical comb actuator and applying a voltage to the vertical comb actuator. The vertical comb drive may include an array of vertical comb actuators and the applying individually applies voltage to the vertical comb actuators.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF PREFERRED EMBODIMENTS

Figure 1:
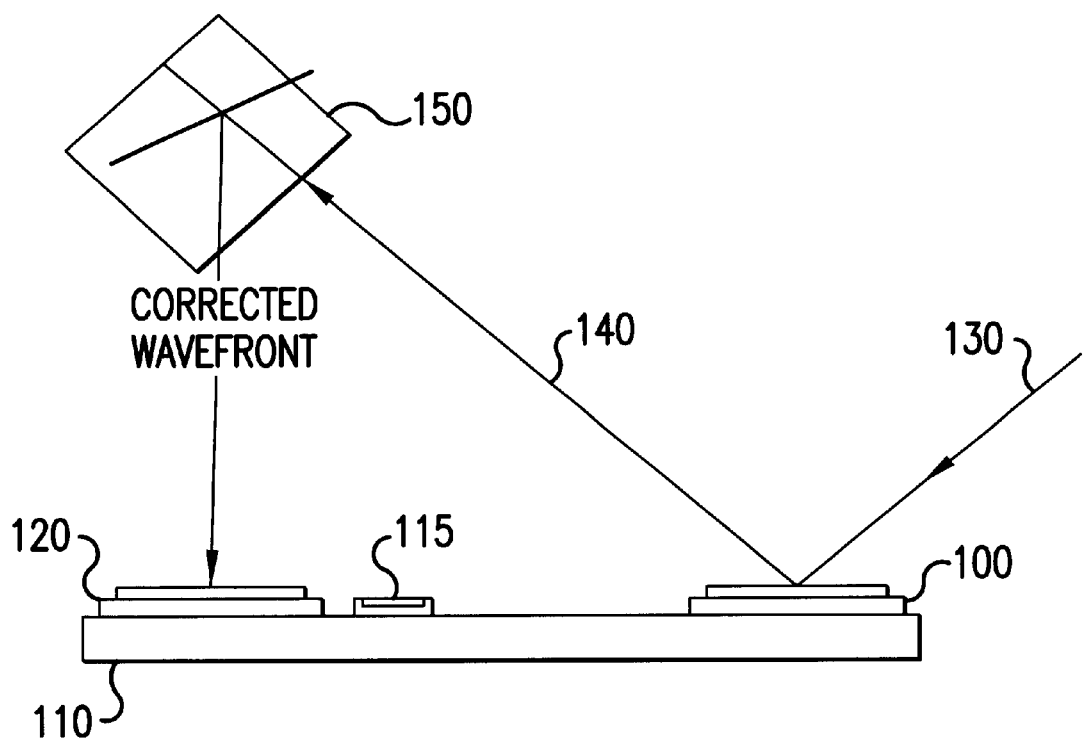
FIG. 1 is a schematic of a simple adaptive optics system.

As noted above, typical MEMS have been based on electrostatic parallel plate capacitor actuators. The separation between the plate determines the amount of stroke available, but an increase in the separation increase the voltage required to deform the mirror. Thus, an increase in the stroke invariably increases the voltage. Further, since this separation between the plates is changing throughout the stroke, the response of the deformable mirror to the applied voltage is nonlinear. Electrostatic comb drives have been demonstrated to produce a large stroke and linear operation, but do not produce the vertical displacement required for use in deformable mirror applications.

Therefore, in accordance with the present invention, a vertical comb mirror actuator (VCAM) having a set of interdigitized shells for actuating a deformable mirror is provided. The VCAM includes a set or array of stator shells and a corresponding set or array of movable slider shells. The mirror membrane is attached to the slider shells. Introducing a voltage potential between the stator shells and the slider shells pulls the slider shells down, deforming the thin membrane mirror. The vertical displacement is the result of a force created by the edge capacitance between the slider shells and the stator shells. The force generated by the comb drives is independent of the relative position of the two electrode plates and is linear while the plates overlap. This essentially eliminates the non-linear voltage-verses-displacement curve so problematic in the prior art. Unlike the parallel plate design, the gap between these elements remains constant throughout the stroke. In addition to the substantially linear operation of the VCAM, the VCAM can also provide a high stroke, e.g., 20 μm, with relatively low voltages, e.g., 35–100 volts.

The actual design of the shells may vary in accordance with a desired application. The shape of the shells is typically designed to maximize surface area between the shells. The other design parameters of the shells include the width of the shells, the width of the gap between the shells, and the number of shells. The length of the shells is determined by the required stroke. For example, when the actuator is to have a stroke of greater than six microns, the typical requirement to correct for atmospheric distortions, applying a maximum of two hundred volts, and a frequency response of 10 kHz, a working design has a shell width of ten microns, an inter-shell gap of five microns and seven slider shells.

The actuator also preferably includes a spring for mounting or suspending the slider shells, biasing the slider shells in a neutral position when no voltage is applied to the stator shells, and preventing horizontal, i.e., side-to-side movement, of the slider shells. Preferably, a spring is positioned at each of the four corners of the actuator element and is attached at one end to a wall provided next to the actuator and at the other end either to the mirror itself or to the slider shells. Thus, the dimensions of the spring also affect the actuator design. A working spring design for the design parameters noted above is a folded spring having two legs, each leg having a length of one hundred twenty-five microns, a width of twenty microns, a spacing between the legs being ten microns and the space between the last leg and the mirror or surface adjoining the slider shells being five microns, and the spring having a spring constant of 12.4 μN/μm.

When providing an array of multi-element actuators, the larger the spacing between the actuators, the less force is needed to move one actuator with respect to adjacent actuators. For the above stroke or throw of six microns, and delta motion between adjacent actuators of one micron, the actuators should be spaced by approximately five hundred microns. The number of actuators in the array is application dependent, and is a design criteria to be considered by those skilled in the art.

The following configurations illustrate different VCAMs in accordance with the present invention. Preferably, the deformable mirror is a thin continuous membrane of reflective material spanning each of the actuator elements in the array. The deformable mirror can also be a segmented design, but the continuous membrane design was found to have superior optical characteristics. The deformable mirror may be made of, for example, silicon nitride coated with metal to reflect at a desired wavelength or electroplated metal. The more precise the deformations need to be, the more flexible the mirror material should be.

The combs or shells may be made by plating nickel on a silicon substrate using a photoresist to define the combs and then planarizing the nickel by lapping the structure, thereby forming the combs with a multi-layer electro-forming. Alternatively, the combs may be made in silicon with a trench refill process alone for use with segmented mirror or using two wafers and anodic wafer bonding for use with continuous mirrors.

Figure 2:
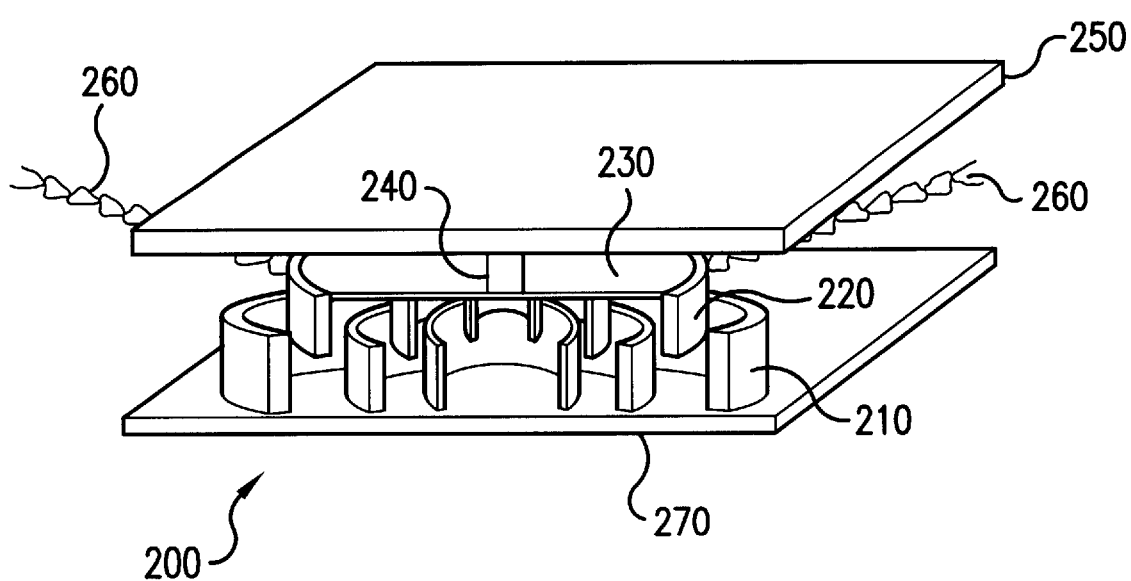
FIG. 2 is a perspective cross-sectional view of a single deformable mirror element having a vertical comb drive of the present invention.

FIG. 2 is a cross-section perspective view of a single deformable mirror actuator element 200 of the present invention. The preferred embodiment consists of two sets of interdigitized circular shells, a set of stator shells 210 and a set of movable slider shells 220. Preferably, a layer 230 overlies the top of the slider shells 220 so that movement of any of the slider shells 220 affects the layer 230. The use of the layer 230 allows for a continuous profile to be realized by the deformable mirror 250, as opposed to the step functions which would result if the slider shells 220 were directly attached to the deformable mirror 250.

The layer 230 is attached by a vertical post 240 to the thin membrane mirror 250, thereby attaching the continuous membrane deformable mirror 250 to the actuator 200. Preferably, the post is in the center of the layer 230 and the mirror 250. The stiffness of the post 240 will determine how much of the movement of the slider shells 220 is translated to the mirror 250. The position and number of posts may be varied to apply the deformation to different regions of the mirror 250. For example, if tilt is a parameter to be controlled, four posts, one at each corner of the actuator may be provided. Typically for a complex shape, the single post is used and the surface area of the mirror region effected by movement of the actuator attached by that post smoothly abuts adjacent mirror regions effected by adjacent actuators.

Applying an activation voltage to the actuator element 200 via the stator shells 210 pulls the slider shells 220 down, thereby deforming the thin membrane mirror 250. The stator shells 210 may be individually addressed. When the activation voltage is removed, the small attached springs 260 pull the slider shells 220 back into position, thereby reforming the thin membrane mirror 250. In practice, an array of actuator elements 200 would be fabricated on a single base substrate 270. The actuator elements 200 would be individually electrically addressed to form a complete adaptive optics deformable membrane mirror 250 by appropriately patterning the substrate 270, or by providing individual conductors for each shell.

Figure 3:
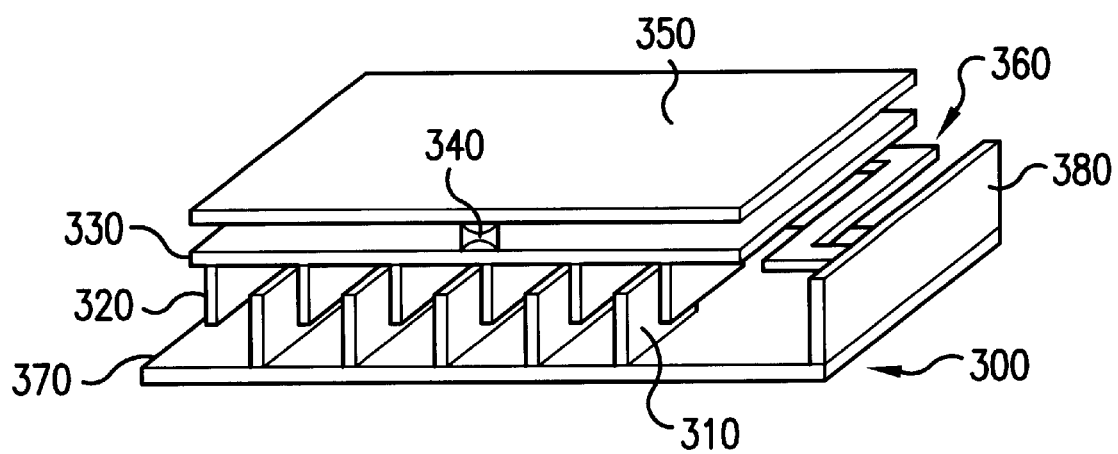
FIG. 3 is a perspective cross-sectional view of an alternative embodiment of the present invention.

FIG. 3 is a perspective cross-section of an alternative embodiment of a single actuator 300 embodying the present invention. The actuator element 300 of this embodiment provides stator shells 310, slider shells 320 integral to a slider top or layer 330, a post 340 connecting the slider shells 320 to the deformable mirror membrane 350, springs 360 to return the deformable mirror 350 to its initial position, and a substrate 370 upon which the actuator resides. In FIG. 3, an example of a wall 380 to which the spring 360 is attached is shown. The view in FIG. 3 is a cut away, as the wall 380 would be beneath the mirror 350.

Figure 4A:
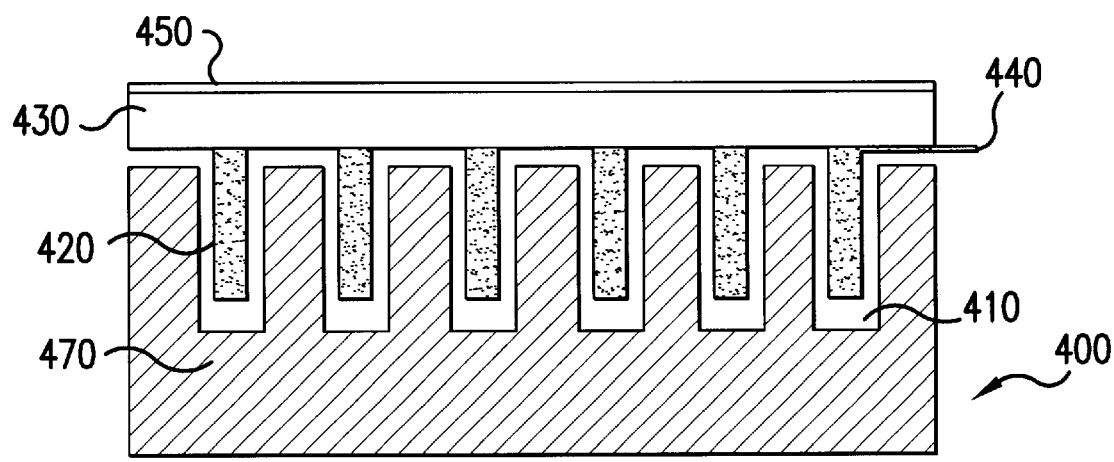
FIG. 4A is a side cross-sectional view of another alternative embodiment of the present invention.
Figure 4B:
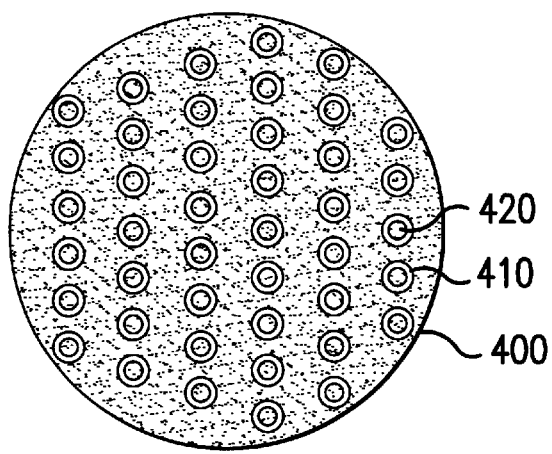
FIG. 4B is a bottom view of the configuration shown in FIG. 4A.

FIG. 4A is a cross section view of yet another alternative embodiment of an actuator embodying the present invention. Unlike the configurations shown in FIGS. 2 and 3, in which each actuator has multiple elements, i.e., more than two shells, and the array of these distinct multiple element actuator, the configuration in FIGS. 4A and 4B is a continuous array of two element actuators. In particular, the base 470 of the actuator 400 is made of a conductive material. In this conductive material there are holes or cavities or trenches 410 which are either drilled, etched, or electroformed or created by any suitable fabrication technique. Inside these holes, there is another conductive material in the form of teeth 420 which does not touch the sides of the holes, but is electrically isolated from the base material. These teeth are mounted on another structural base 430 that keeps the teeth 420 rigidly in place within the holes 410 in the base 400. This base 430 can be either electrically conductive or insulating, but does need to provide a surface for the electrical conductor 440 which connects each tooth 420 to a voltage source.

When a voltage is applied between the teeth 420 and the actuator base 400, an electrostatic force is generated pulling the teeth 420 into the holes 410. Note in this embodiment that the voltage is applied to individually addressed teeth 420 which are the moving elements of the actuator 400, rather than to the stationary elements as in the previous embodiments. If it is desired that this vertical motion be applied to an optical mirror surface 450, that surface is applied to the tooth base material 430 by some suitable application method such as sputtering or vapor deposition. As in FIGS. 2 and 3, springs attached outside of the actuator region are provided for supporting the teeth 420 above the cavities 410.

FIG. 4A illustrates the same embodiment as FIG. 4B, but it is a top view instead of a cross section view. As can be seen from the perspective shown in FIG. 4B, the teeth can be circular, although the teeth can be any shape, e.g., rectangular, octagonal, etc., to match the needs of any particular application or fabrication method. Further, while the surface in FIG. 4B is circular, it may be any desired shape, including rectangular.

The configuration of FIGS. 4A and 4B is more useful for effecting bulk parameters, such as displacement plus tilt in two orthogonal directions, while the configurations in FIGS. 2 and 3 are more useful for effecting complex shapes on the mirror surface, as explained below.

Figure 5:
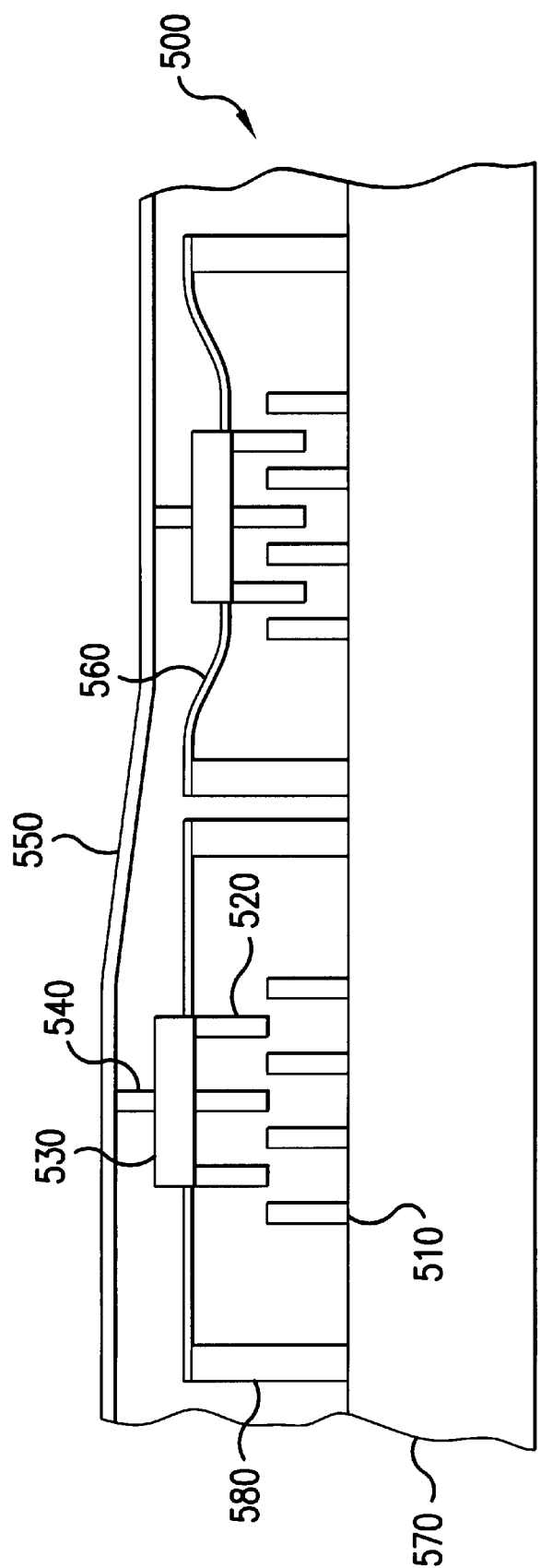
FIG. 5 is a cross section of two adjacent actuators in accordance with the present invention.

FIG. 5 is a cross-section of two adjacent actuators 500 attached to the same continuous membrane mirror 550. The actuator 500 may have the configuration of actuator 200 shown in FIG. 2 or that of the actuator 300 shown in FIG. 3. In practice, there will be hundreds of evenly spaced actuators 500 for one continuous membrane mirror 550.

The actuators 500 include stator 510 and sliders 520. The sliders 520 are integrated with a slider top 530. Posts 540 attach the slider 520 via the slider top 530 to the deformable mirror membrane 550. The posts 540 are thus evenly spaced on the under side of the membrane 550 and are centered on the actuator 500 and the portion of the mirror 550 the actuator 500 is to effect. Each actuator 500 and post 540 will pull on the mirror 550 with the strength of the actuator force that is controlled by the amplitude of the applied voltage.

If only one actuator 500 is actuated, it will cause a dimple in the membrane 500 as shown in FIG. 5. The stiffness or rigidity of the membrane 550 itself prevents the membrane from being deflected with sharp edges at the deflection point of the posts 540. Instead, the result is the gradually curved dimple as shown in FIG. 5, allowing the variation in the surface from one actuator to the next to be smooth. The actuators 500 are all addressed separately, so that when multiple actuators are actuated each with different forces, very complex surface shapes can be produced.

In addition, springs 560 return the deformable mirror 550 to its initial position as shown in the actuator on the left in FIG. 5. The actuator 500 resides on a substrate 570. An anchor or wall 580, for each actuator 500, serves to support the spring 560. The actuator on the right is in the deflected position with the springs 560 bent and the membrane mirror 550 deformed. This deflection is accomplished by applying a voltage between the stator 510 and the slider 530, thereby resulting in an attractive force between them, pulling the slider 530 down as shown on the right relative to the initial position shown on the left.

Many variations in the design of the comb itself may be realized in accordance with the present invention. The density of the actuators is also application specific. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A deformable mirror comprising:

a vertical comb drive;

a reflective surface attached to said vertical comb drive; and a spring for biasing said vertical comb drive to maintain said reflective surface in an original position absent application of a voltage to said vertical comb drive.

2. A deformable mirror comprising:

a vertical electrostatic comb drive including a first array of stationary elements and a second array of moving elements correspondingly interspersed with said first array;

a reflective surface attached to said second array;

a layer covering tops of elements of said second array; and a spring for suspending said first array relative to said second array, said spring being attached to said layer.

3. The deformable mirror according to claim 2 wherein said stationary elements and said movable elements are circular.

4. The deformable mirror according to claim 2, wherein said stationary elements and said movable elements are planar.

5. The deformable mirror according to claim 2, wherein said layer is attached directly to said reflective surface.

6. The deformable mirror according to claim 2, wherein voltage is applied to each stationary element of said first array individually or each moving element of said second array individually.

7. The deformable mirror according to claim 2, wherein said vertical electrostatic comb drive comprises plurality of cavities and teeth interdigitally mounted with said cavities, said reflective surface being attached to said teeth.

8. The deformable mirror according to claim 7, further comprising a top layer between the teeth and the reflective surface.

9. The deformable mirror according to claim 7, further comprising a conductor for individually connecting each tooth of said teeth to a voltage source.

10. A deformable mirror comprising:

a vertical electrostatic comb drive;

a reflective surface attached to said vertical comb drive, wherein said vertical comb drive comprises a first array of stationary elements and a second array of moving elements correspondingly interspersed with said first array, said reflective surface being attached to said second array and defining a plane; said vertical comb drive, when actuated, displacing said surface in a direction orthogonal to the plane thereof;

a layer covering tops of elements of said second array; and a post attaching said layer to said reflective surface.

11. The deformable mirror according to claim 10, wherein said post is in a center of said reflective surface.

12. A deformable mirror comprising:
   a vertical electrostatic comb drive including an array of vertical comb actuators, wherein said vertical comb drive includes a first array of stationary elements and a second array of moving elements correspondingly interspersed with said first array;
   a reflective surface attached to said vertical comb drive, said reflective surface being attached to said second array and defining a plane, said reflective surface being displaced in a direction orthogonal to the plane thereof when said vertical comb drive is actuated; and
   springs for individually suspending each of said second array of each actuator in said array.

13. The deformable mirror according to claim 12, further comprising an anchor for supporting said springs.

14. A displaceable surface comprising:
   a vertical electrostatic comb drive;
   a surface attached to said vertical comb drive and defining a plane; and
   a spring for biasing said vertical comb drive to maintain said surface in an original position absent application of a voltage to said vertical comb drive;
   said vertical comb drive, when actuated, displacing said surface in a direction orthogonal to the plane thereof.

15. The displaceable surface of claim 14, wherein said surface is reflective.

16. A displaceable surface comprising:
   a vertical electrostatic comb drive;
   a surface attached to said vertical comb drive, wherein said vertical comb drive comprises a first array of stationary elements and a second array of moving elements correspondingly interspersed with said first array, said surface defining a plane and being attached to said second array, said surface being displaced in a direction orthogonal to the plane thereof when said vertical electrostatic comb drive is actuated;
   a layer covering tops of elements of said second array; and
   a spring for suspending said first array relative to said second array, said spring being attached to said layer.

17. The displaceable surface of claim 16 wherein the vertical electrostatic comb drive is provided on a substrate and said surface is generally parallel to said substrate.

18. The displaceable surface of claim 16 wherein said displaceable surface includes plural vertical electrostatic comb drives to which said surface is attached, each said vertical electrostatic comb drive locally displacing said surface in a direction generally orthogonal to a plane generally defined by said surface.

19. The displaceable surface of claim 18 wherein said plural actuators are driven to tilt said surface.

20. The displaceable surface of claim 16 further comprising a mirror mounted substantially parallel to said surface.

21. The displaceable surface according to claim 16, wherein said stationary elements and said movable elements are circular.

22. The displaceable surface according to claim 16, wherein said stationary elements and said movable elements are planar.

23. The displaceable surface according to claim 16, wherein said layer is attached directly to said surface.

24. The displaceable surface according to claim 16, wherein voltage is applied to each stationary element of said first array individually or each moving element of said second array individually.

25. The displaceable surface according to claim 16, wherein said vertical comb drive comprises an array of vertical comb actuators.

26. The displaceable surface according to claim 25, means for individually providing voltage to each actuator of said array.

27. The displaceable surface according to claim 16, wherein said vertical comb drive comprises plurality of cavities and teeth interdigitally mounted with said cavities, said surface being attached to said teeth.

28. The displaceable surface according to claim 27, further comprising a top layer between the teeth and the surface.

29. The displaceable surface according to claim 27, further comprising a conductor for individually connecting each tooth of said teeth to a voltage source.

30. The displaceable surface of claim 16, wherein said surface is reflective.

31. A displaceable surface comprising:
   a vertical electrostatic comb drive;
   a surface attached to said vertical comb drive, wherein said vertical comb drive comprises a first array of stationary elements and a second array of moving elements correspondingly interspersed with said first array, said surface defining a plane and being attached to said second array, said surface being displaced in a direction orthogonal to the plane thereof when said vertical electrostatic comb drive is actuated;
   a layer covering tops of elements of said second array; and
   a post attaching said layer to said surface.

32. The displaceable surface according to claim 31, wherein said post is in a center of said surface.

33. A displaceable surface comprising:
   a vertical electrostatic comb drive including an array of vertical comb actuators;
   a surface attached to said vertical comb drive, wherein said vertical comb drive comprises a first array of stationary elements and a second array of moving elements correspondingly interspersed with said first array, said surface defining a plane and being attached to said second array, said surface being displaced in a direction orthogonal to the plane thereof when said vertical electrostatic comb drive is actuated; and
   springs for individually suspending each of said second array of each actuator in said array.

34. The displaceable surface according to claim 33, further comprising an anchor for supporting said springs.

* * * * *